(12) United States Patent
Chou

(10) Patent No.: US 6,259,230 B1
(45) Date of Patent: Jul. 10, 2001

(54) APPARATUS FOR CHARGING AND DISCHARGING A BATTERY DEVICE

(75) Inventor: Yen-Chia Chou, Tainan Hsien (TW)

(73) Assignee: Chroma Ate Inc., Taipei Hsien (TW)

( * ) Notice: Subject to any disclaimer, the term of this patent is extended or adjusted under 35 U.S.C. 154(b) by 0 days.

(21) Appl. No.: 09/633,546

(22) Filed: Aug. 7, 2000

(30) Foreign Application Priority Data

Aug. 20, 1999 (TW) ............................................. 088214202

(51) Int. Cl.[7] ....................................................... H02J 7/00
(52) U.S. Cl. ............................................ 320/128; 320/134
(58) Field of Search ..................................... 320/128, 132, 320/134

(56) References Cited

U.S. PATENT DOCUMENTS 5,637,980 * 6/1997 Wu ........................................ 320/128

* cited by examiner

Primary Examiner—Peter S. Wong
Assistant Examiner—Gregory J Toatley, Jr.
(74) Attorney, Agent, or Firm—Ladas & Parry

(57) ABSTRACT

An apparatus is adapted for charging and discharging a battery device having positive and negative terminals. The apparatus includes a power supplying unit operable so as to provide a direct current voltage output, a current control unit coupled to the power supplying unit so as to receive the direct current voltage output therefrom, and a control device coupled to the current control unit and adapted to be coupled to the battery device. The control device enables the current control unit when a battery voltage of the battery device is below a predetermined voltage value, and disables the current control unit when the battery voltage is at least equal to the predetermined voltage value. The current control unit is adapted to be coupled to the battery device in a charging state, where the positive terminal of the battery device is coupled to the current control unit so as to permit charging of the battery device when the current control unit is enabled by the control device. The current control unit is further adapted to be coupled to the battery device in a discharging state, where the negative terminal of the battery device is coupled to the current control unit so as to permit discharging of the battery device when the current control unit is enabled by the control device.

13 Claims, 4 Drawing Sheets

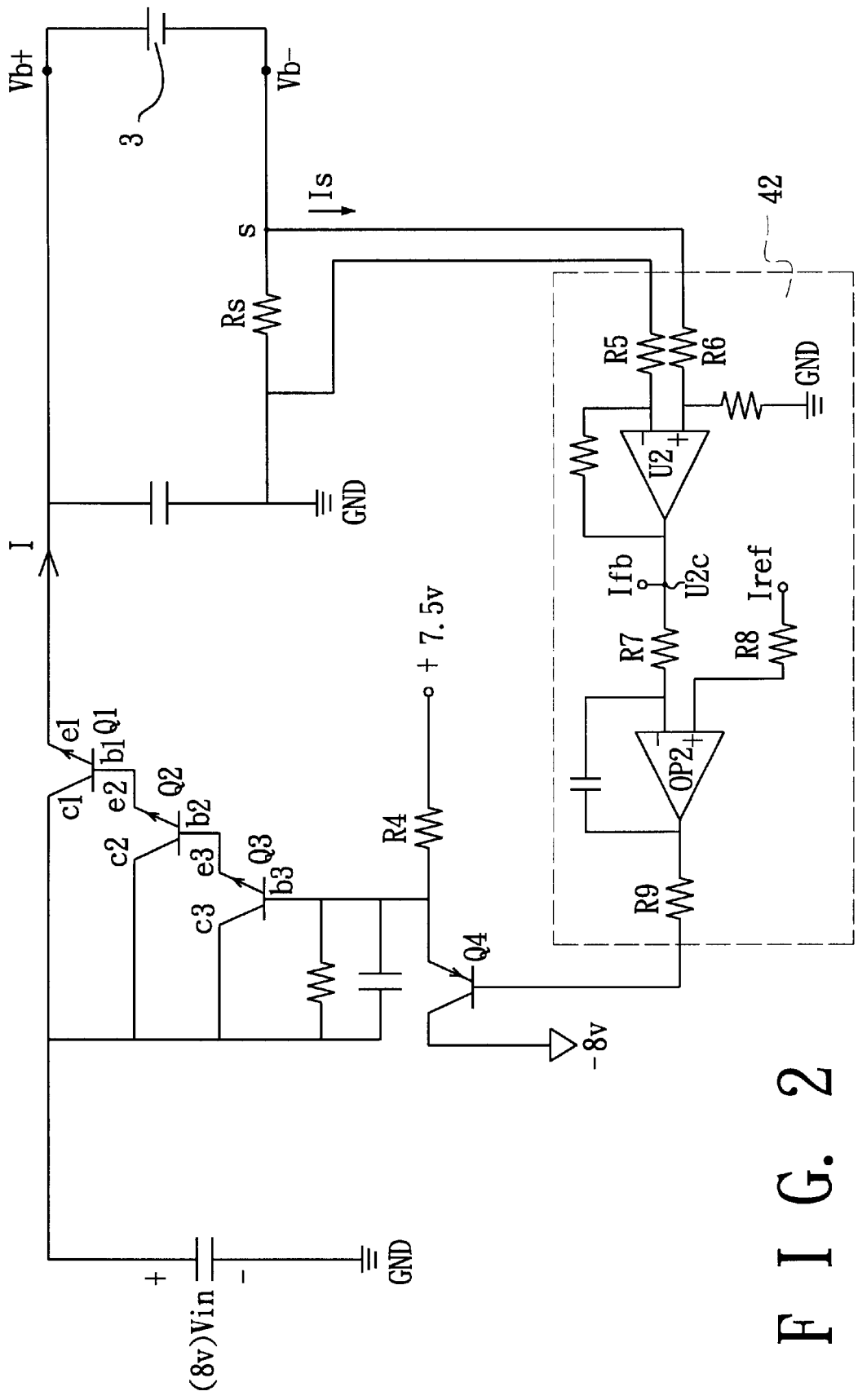
F I G. 2

APPARATUS FOR CHARGING AND DISCHARGING A BATTERY DEVICE

BACKGROUND OF THE INVENTION

1. Field of the Invention

The invention relates to an apparatus for charging and discharging a battery device, more particularly to an apparatus for charging and discharging a battery device that can control accurately charging and discharging currents.

2. Description of the Related Art

Lithium batteries are known dc power supplying devices. In the manufacturing process of lithium batteries, it is necessary to repeatedly perform charging and discharging tests for the lithium batteries. Because charging and discharging are conventionally performed using separate circuits, the need to switch between the two circuits during testing results inconvenience and higher costs. In addition, a conventional discharge circuit generally includes a resistor or an electrical load to draw the power from a battery. The electronic load is a power device, such as a BJT or a MOSFET, which has a saturation voltage acting thereon when working in the saturation region. Since the power device is turned off when the battery is discharged to the saturation voltage of the power device, the battery thus cannot be fully discharged by means of the conventional discharge circuit, thereby resulting in an impact on the service life of the battery.

SUMMARY OF THE INVENTION

Therefore, the object of the present invention is to provide an apparatus for charging and discharging a battery device that can control accurately charging and discharging currents and that can enable a battery device to fully discharge.

According to the present invention, an apparatus is adapted for charging and discharging a battery device having positive and negative terminals. The apparatus includes a power supplying unit, a current control unit and a control device.

The power supplying unit is operable so as to provide a direct current voltage output.

The current control unit is coupled to the power supplying unit so as to receive the direct current voltage output therefrom.

The control device is coupled to the current control unit, and is adapted to be coupled to the battery device. The control device enables the current control unit when a battery voltage of the battery device is below a predetermined voltage value, and disables the current control unit when the battery voltage is at least equal to the predetermined voltage value.

The current control unit is adapted to be coupled to the battery device in a charging state, where the positive terminal of the battery device is coupled to the current control unit so as to permit charging of the battery device when the current control unit is enabled by the control device.

The current control unit is further adapted to be coupled to the battery device in a discharging state, where the negative terminal of the battery device is coupled to the current control unit so as to permit discharging of the battery device when the current control unit is enabled by the control device.

BRIEF DESCRIPTION OF THE DRAWINGS

Other features and advantages of the present invention will become apparent in the following detailed description of the preferred embodiments with reference to the accompanying drawings, of which:

FIG. 2 is a schematic equivalent electrical circuit diagram illustrating the preferred embodiment in a charging state;

DETAILED DESCRIPTION OF THE PREFERRED EMBODIMENTS

Figure 1:
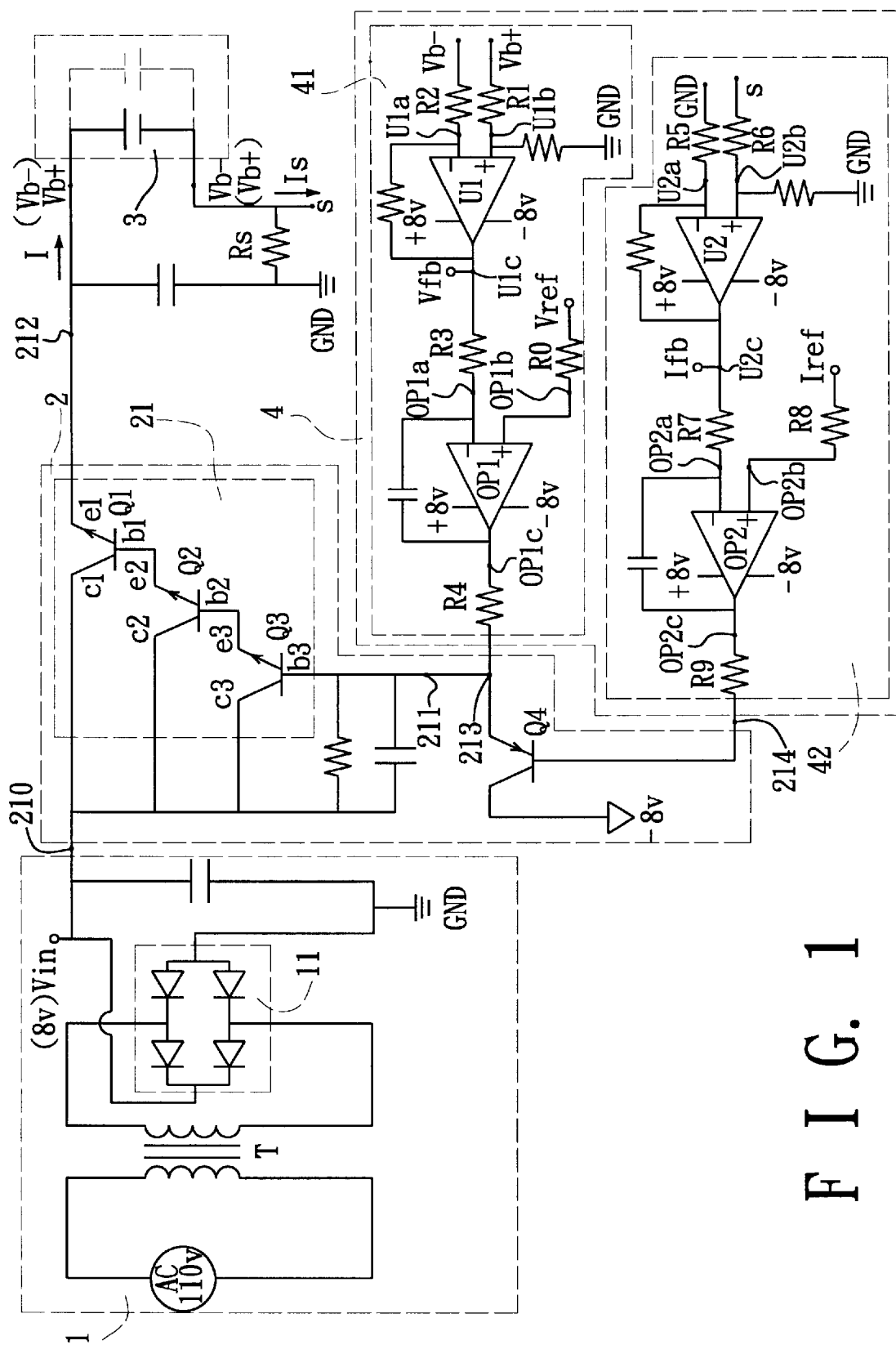
FIG. 1 is a schematic electrical circuit diagram illustrating the preferred embodiment of an apparatus for charging and discharging a battery device according to this invention.

Referring to FIG. 1, according to the preferred embodiment of the present invention, an apparatus for charging and discharging a battery device 3, such as a lithium battery, a nickel-hydrogen battery or a nickel-cadmium battery, which has positive and negative terminals (Vb+, Vb−), is shown to include a power supplying unit 1, a current control unit 2, and a control device 4.

The power supplying unit 1 is provided with a transformer (T), a bridge rectifier 11 and a capacitor, and is adapted for transforming an AC power into an 8-volt direct current voltage output (Vin).

The current control unit 2 is coupled to the power supplying unit 1 so as to receive the direct current voltage output (Vin) therefrom. The current control unit 2 includes a current amplifier 21 and a control load. The current amplifier 21 has a power input 210 coupled to the power supplying unit 1 to receive the direct current voltage output (Vin) therefrom, a bias input 211, and a current output 212. The current amplifier 21 is operable so as to amplify a current signal at the bias input 211 and to provide an amplified current signal at the current output 212. The current output 212 is adapted to be connected to the battery device 3 so as to supply the amplified current signal thereto to initiate charging of the battery device 3. The current amplifier 21 includes a plurality of Darlington-connected transistors (Q1, Q2, Q3). The collectors (c1, c2, c3) of the transistors (Q1, Q2, Q3) are connected to the power input 210. The emitter (e1) of the transistor (Q1) is connected to the current output 212. The base (b1) of the transistor (Q1) is connected to the emitter (e2) of the transistor (Q2). The base (b2) of the transistor (Q2) is connected to the emitter (e3). The base (b3) of the transistor (Q3) is connected to the bias input 211. In this embodiment, the control load is a transistor (Q4). The emitter of the transistor (Q4) serves as a current input 213 coupled to the bias input 211. The base of the transistor (Q4) serves as a control input 214. The collector of the transistor (Q4) is coupled to a collector bias equal to −8-volts.

The control device 4 is coupled to the current control unit 2, and is adapted to be coupled to the battery device 3. The control device 4 enables the current control unit 2 when a battery voltage of the battery device 3 is below a predetermined voltage value, and disables the current control unit 2 when the battery voltage is at least equal to the predetermined voltage value. The control device 4 includes an amplifier control unit 41 and a load control unit 42.

The amplifier control unit 41 is coupled to the bias input 211, and is adapted to be coupled to the battery device 3. The amplifier control unit 41 generates a first control signal at the bias input 211 to enable the current amplifier 21 when the battery voltage is below the predetermined voltage value, and further generates a second control signal at the bias input 211 to disable the current amplifier 21 when the battery voltage reaches the predetermined voltage value. The amplifier control unit 41 includes a differential amplifier (U1) and a comparator, such as an operational amplifier (OP1). The differential amplifier (U1) has an input side and an output side (U1c). The input side has an inverting input (U1a) adapted to be coupled to the negative terminal (Vb−) of the battery device 3 via a resistor (R2), and a non-inverting input (U1b) adapted to be coupled to the positive terminal (Vb+) of the battery device 3 via a resistor (R1). The different amplifier (U1) generates an output signal (Vfb) at the output side (U1c) corresponding to the battery voltage. The operational amplifier (OP1) has an inverting input (OP1a) that serves as a first input coupled to the output side (U1c) of the differential amplifier (U1) via a resistor (R3), a non-inverting input (OP1b) that serves as a second input and that receives a reference voltage signal (Vref) corresponding to the predetermined voltage value, and an output (OP1c) coupled to the bias input 211.

The load control unit 42 is coupled to the control input 214, and is adapted to be coupled to the battery device 3. The load control unit 42 enables the transistor (Q4) to adjust magnitude of the current signal at the bias input 211 to adjust in turn magnitude of the amplified current signal at the current output 212 so as to maintain current flow through the battery device 3 at a predetermined current value. The load control unit 42 includes a differential amplifier (U2) and a comparator, such as an operational amplifier (OP2). The differential amplifier (U2) has an input side and an output side (U2c). The input side has an inverting input (U2a) that is grounded via a resistor (R2), and a non-inverting input (U2b) coupled to a junction (s) via a resistor (R6). The junction (s) is adapted to be coupled to the battery device 3. The differential amplifier (U2) generates an output signal (Ifb) at the output side (U2c) corresponding to the current (I) flowing through the battery device 3. The operational amplifier (0P2) has an inverting input (OP2a) that serves as a first input coupled to the output side (U2c) of the differential amplifier (U2) via a resistor (R7), a non-inverting input (OP1b) that serves as a second input and that receives a reference current signal (Iref) corresponding to the predetermined current value, and an output (OP2c) coupled to the control input 214.

The current control unit 4 is adapted to be coupled to the battery device 3 in a charging state, where the positive terminal (Vb+) of the battery device 3 is coupled to the current control unit 2, and the negative terminal (Vb−) of the battery device 3 is coupled to the junction (s) so as to permit charging of the battery device 3 when the current control unit 2 is enabled by the control device 4.

The current control unit 4 is further adapted to be coupled to the battery device 3 in a discharging state, wherein the negative terminal (Vb−) of the battery device 3 is coupled to the current control unit 2, and the positive terminal (Vb+) of the battery device 3 is coupled to the junction (s) so as to permit discharging of the battery device 3 when the current control unit 2 is enabled by the control device 4.

The apparatus for charging and discharging the battery device 3 of the preferred embodiment operates as follows:

1. In the charging state, the battery device 3 is to be charged to the predetermined voltage value equal to 5 volts. Referring to FIGS. 1 and 2, the positive terminal (Vb+) of the battery device 3 is coupled to the emitter (e1) of the transistor (Q1), and the negative terminal (Vb−) of the battery device 3 is coupled to the junction (s). The apparatus further includes a resistor (Rs) that connects the junction (s) to the ground. Initially, the battery voltage of the battery device 3 is nearly equal to zero. The output signal (Vfb) generated by the differential amplifier (U1) of the amplifier control unit 41 at the output side (U1c) is less than the reference voltage signal (Vref), which has a voltage magnitude equal to the predetermined voltage value. As such, the operational amplifier (OP1) generates the first control signal equal to +7.5 volts at the bias input 211 so as to enable the current amplifier 2 to supply the amplified current signal to the battery device 3.

Simultaneously, the differential amplifier (U2) of the load control unit 42 receives a part (Is) of the current (I) flowing through the battery device 3, and generates the output signal (Ifb) at the output side (U2c) to the operational amplifier (OP2). After the operational amplifier (OP2) compares the output signal (Ifb) with the reference current signal (Iref) corresponding to the predetermined current value, the operational amplifiers (OP2) outputs a negative saturation voltage equal to −7.5 volts to activate the transistor (Q4) so as to decrease the amplified current signal to the battery device 3 when the output signal (Ifb) is greater than the reference current signal (Iref), and a positive saturation voltage equal to +7.5 volts to cut off the transistor (Q4) so as not to influence the amplified current signal to the battery device 3 when the output signal (Ifb) is less than the reference current signal (Iref). The load control unit 42 thus maintains the current flow through the battery device 3 at the predetermined current value.

When the output signal (Vfb) generated by the differential amplifier (U1) of the amplifier control unit 41 at the output side (U1c) is greater than or equal to the reference voltage signal (Vref), i.e. the battery device 3 is fully charged, the operational amplifier (OP1) generates the second control signal equal to −7.5 volts at the bias input 211 to cut off the transistor (Q3) so as to disable the current amplifier 2 from supplying the amplified current signal to the battery device 3.

Figure 3:
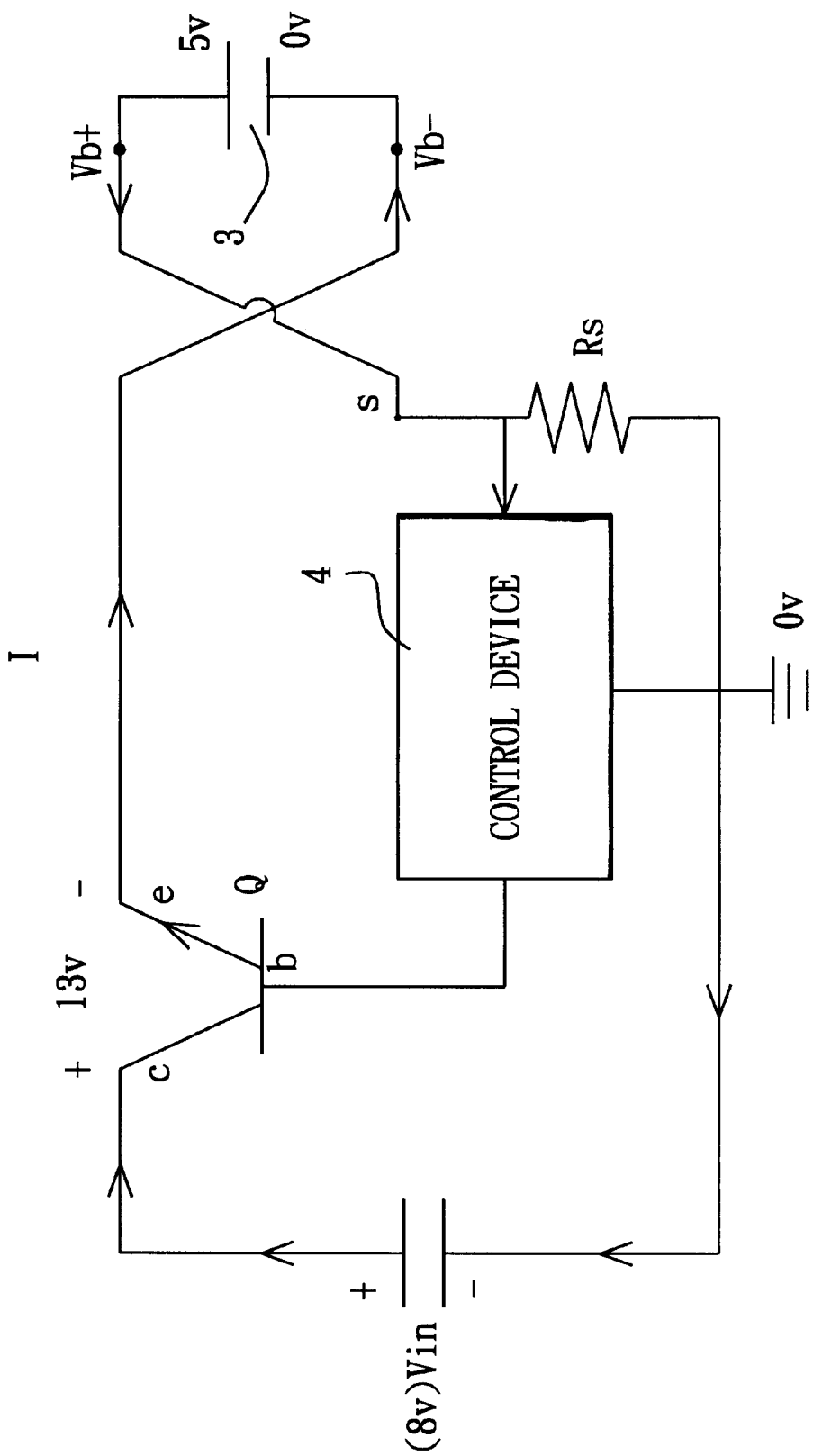
FIG. 3 is a schematic equivalent electrical circuit diagram illustrating the preferred embodiment in a discharging state.

2. In the discharging state, referring to FIGS. 1 and 3, the negative terminal (Vb−) of the battery device 3 is coupled to the emitter (e1) of the transistor (Q1), and the positive terminal (Vb+) of the battery device 3 is coupled to the junction (s). During discharge, since the output signal (Vfb) generated by the differential amplifier (U1) of the amplifier control unit 41 at the output side (U1c) is always less than the reference voltage signal (Vref), the operational amplifier (OP1) generates the first control signal equal to +7.5 volts at the bias input 211. As such, the battery voltage of the battery device 3 is discharged via the resistor (Rs). Simultaneously, the load control unit 42 still maintains the current flow from the battery device 3 at the predetermined current value. As shown in FIG. 3, an equivalent transistor (Q) is used in place of the current control unit 2. The collector (c) of the transistor (Q) is connected to the direct current voltage output (Vin), which serves as a collector bias. If the battery voltage of the battery device 3 is equal to 5 volts, the collector-emitter voltage is equal to 13 volts. The transistor (Q) enables the battery device 3 to discharge until the battery voltage of the battery device 3 is equal to zero.

Figure 4:
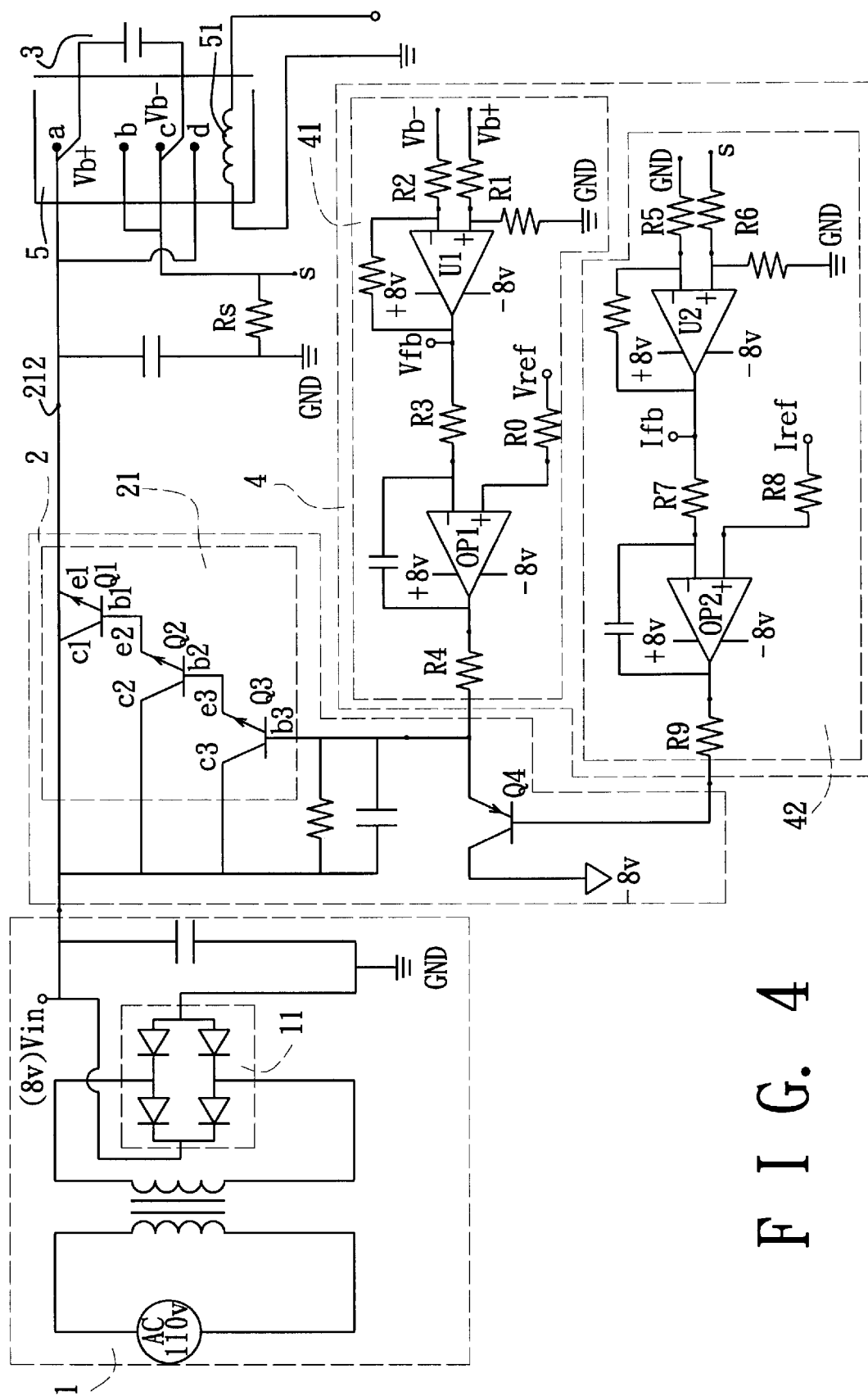
FIG. 4 is a schematic electrical circuit diagram illustrating a modified preferred embodiment of this invention.

Referring to FIG. 4, in a modified preferred embodiment of the apparatus of the present invention, a switch 5 is coupled to the current control unit 2 and is adapted to be coupled to the battery device 3. The switch 5 has a relay 51 and four terminals (a, b, c, d). The terminals (a, d) are coupled to the current output 212 of the current control unit 2. The terminals (b, c) are coupled to the junction (s). The switch 5 is operable to couple the current control unit 2 to the battery device 3 in the charging state, where the positive terminal (Vb+) of the battery device 3 is connected to the terminal (a) and the negative terminal (Vb−) is connected to the terminal (C) , or in the discharging state, where the positive terminal (Vb+) of the battery device 3 is connected to the terminal (b) and the negative terminal (Vb−) of the battery device 3 is connected to the terminal (d). Due to the presence of the switch 5, the apparatus can be conveniently switched between the charging and discharging states.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An apparatus for charging and discharging a battery device having positive and negative terminals, comprising:
  a power supplying unit operable so as to provide a direct current voltage output;
  a current control unit coupled to said power supplying unit so as to receive the direct current voltage output therefrom; and
  a control device coupled to said current control unit and adapted to be coupled to the battery device, said control device enabling said current control unit when a battery voltage of the battery device is below a predetermined voltage value, and disabling said current control unit when the battery voltage is at least equal to the predetermined voltage value;
  said current control unit being adapted to be coupled to the battery device in a charging state, where the positive terminal of the battery device is coupled to said current control unit so as to permit charging of the battery device when said current control unit is enabled by said control device;
  said current control unit being further adapted to be coupled to the battery device in a discharging state, where the negative terminal of the battery device is coupled to said current control unit so as to permit discharging of the battery device when said current control unit is enabled by said control device.

2. The apparatus of claim 1, wherein:
  said current control unit includes a current amplifier having a power input coupled to said power supplying unit to receive said direct current voltage output therefrom, a bias input, and a current output, said current amplifier being operable so as to amplify a current signal at said bias input and to provide an amplified current signal at said current output, said current output being adapted to be connected to the battery device; and
  said control device includes an amplifier control unit coupled to said bias input and adapted to be coupled to the battery device, said amplifier control unit generating a first control signal at said bias input to enable said current amplifier when the battery voltage is below the predetermined voltage value, and further generating a second control signal at said bias input to disable said current amplifier when the battery voltage reaches the predetermined voltage value.

3. The apparatus of claim 2, wherein said amplifier control unit includes:
  a differential amplifier having an input side adapted to be coupled to the battery device, and an output side, said differential amplifier generating an output signal at said output side corresponding to the battery voltage; and
  a comparator having a first input coupled to said output side of said differential amplifier, a second input that receives a reference voltage signal corresponding to the predetermined voltage value, and an output coupled to said bias input.

4. The apparatus of claim 2, wherein said current amplifier includes a plurality of Darlington-connected transistors.

5. The apparatus of claim 2, wherein:
  said current control unit further includes a control load having a current input coupled to said bias input, and a control input; and
  said control device further includes a load control unit coupled to said control input and adapted to be coupled to the battery device, said load control unit enabling said control load to adjust magnitude of the current signal at said bias input to adjust in turn magnitude of the amplified current signal at said current output so as to maintain current flow through the battery device at a predetermined current value.

6. The apparatus of claim 5, wherein said control load is a transistor.

7. The apparatus of claim 5, wherein said load control unit includes:
  a differential amplifier having an input side adapted to be coupled to the battery device, and an output side, said differential amplifier generating an output signal at said output side corresponding to the current flow through the battery device; and
  a comparator having a first input coupled to said output side of said differential amplifier, a second input that receives a reference current signal corresponding to the predetermined current value, and an output coupled to said control input.

8. The apparatus of claim 1, further comprising a switch coupled to said current control unit and adapted to be coupled to the battery device, said switch being operable to couple said current control unit to the battery device in a selected one of the charging and discharging states.

9. An apparatus for charging a battery device, comprising:
  a power supplying unit operable so as to provide a direct current voltage output;
  a current control unit including a current amplifier and a control load,
    said current amplifier having a power input coupled to said power supplying unit to receive said direct current voltage output therefrom, a bias input, and a current output, said current amplifier being operable so as to amplify a current signal at said bias input and to provide an amplified current signal at said current output, said current output being adapted to be connected to the battery device so as to supply said amplified current signal thereto to initiate charging of the battery device,
    said control load having a current input coupled to said bias input, and a control input;
  an amplifier control unit coupled to said bias input and adapted to be coupled to the battery device, said amplifier control unit generating a first control signal at said bias input to enable said current amplifier when a battery voltage of the battery device is below a predetermined voltage value, and further generating a second control signal at said bias input to disable said current amplifier when the battery voltage reaches the predetermined voltage value; and a load control unit coupled to said control input and adapted to be coupled to the battery device, said load control unit enabling said control load to adjust magnitude of the current signal at said bias input to adjust in turn magnitude of the amplified current signal at said current output so as to maintain current flow through the battery device at a predetermined current value.

10. The apparatus of claim 9, wherein said current amplifier includes a plurality of Darlington-connected transistors.

11. The apparatus of claim 9, wherein said control load is a transistor.

12. The apparatus of claim 9, wherein said amplifier control unit includes:

a differential amplifier having an input side adapted to be coupled to the battery device, and an output side, said differential amplifier generating an output signal at said output side corresponding to the battery voltage; and a comparator having a first input coupled to said output side of said differential amplifier, a second input that receives a reference voltage signal corresponding to the predetermined voltage value, and an output coupled to said bias input.

13. The apparatus of claim 9, wherein said load control unit includes:

a differential amplifier having an input side adapted to be coupled to the battery device, and an output side, said differential amplifier generating an output signal at said output side corresponding to the current flow through the battery device; and a comparator having a first input coupled to said output side of said differential amplifier, a second input that receives a reference current signal corresponding to the predetermined current value, and an output coupled to said control input.

* * * * *